United States Patent
Shimoda et al.

(10) Patent No.: US 10,873,010 B2
(45) Date of Patent: Dec. 22, 2020

(54) LIGHT-EMITTING DEVICE

(71) Applicant: STANLEY ELECTRIC CO., LTD., Tokyo (JP)

(72) Inventors: Yoichi Shimoda, Tokyo (JP); Yasuhiro Ono, Tokyo (JP); Yusuke Yamashita, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/443,635

(22) Filed: Jun. 17, 2019

(65) Prior Publication Data

US 2019/0393386 A1    Dec. 26, 2019

(30) Foreign Application Priority Data

Jun. 20, 2018    (JP) .................................. 2018-116751

(51) Int. Cl.
*H01L 33/50* (2010.01)
*H01L 33/44* (2010.01)
*H01L 33/56* (2010.01)

(52) U.S. Cl.
CPC ............ *H01L 33/504* (2013.01); *H01L 33/44* (2013.01); *H01L 33/56* (2013.01)

(58) Field of Classification Search
CPC ..... H01L 33/504; H01L 33/44; H01L 33/502; H01L 33/505; H01L 33/507; H01L 33/506; H01L 33/55

See application file for complete search history.

(56) References Cited

U.S. PATENT DOCUMENTS

| | | | |
|---|---|---|---|
| 2012/0273811 A1* | 11/2012 | Krauter | ............... H01L 31/0203 257/88 |
| 2017/0263591 A1* | 9/2017 | Abe | .................... H01L 25/0753 |
| 2017/0294563 A1 | 10/2017 | Hashimoto | |
| 2018/0358339 A1 | 12/2018 | Iguchi | |

FOREIGN PATENT DOCUMENTS

| | | |
|---|---|---|
| EP | 3182470 A1 | 6/2017 |
| JP | 2010219324 A | 9/2010 |
| JP | 2014107307 A | 6/2014 |
| WO | 2017094461 A1 | 6/2017 |

OTHER PUBLICATIONS

Extended European Search Report (EESR) dated Oct. 9, 2019 issued in European Application No. 19180374.1.

* cited by examiner

*Primary Examiner* — Changhyun Yi
(74) *Attorney, Agent, or Firm* — Holtz, Holtz & Volek PC

(57) ABSTRACT

A light-emitting device includes a substrate, a light-emitting element disposed on the substrate, a light transmitting member disposed on the light-emitting element, and a covering body disposed on the substrate. The covering body covers a side surface of the light transmitting member and has an exposed upper surface. A particle group composed of a plurality of particles is dispersed in the covering body. The particle group includes a plurality of titanium oxide particles or zinc oxide particles dispersed in a vicinity of an upper surface of the covering body and each having a portion having a narrower band gap than in other portions of the particle.

23 Claims, 10 Drawing Sheets

US 10,873,010 B2

LIGHT-EMITTING DEVICE

BACKGROUND OF THE INVENTION

1. Field of the Invention

The present invention relates to a light-emitting device including a light-emitting element such as a light-emitting diode.

2. Background Art

Conventionally, there has been known a light-emitting device in which a light-emitting element that emits light having a predetermined wavelength (emission color) and a wavelength converter that converts the wavelength of light from the light source are combined (for example, Japanese Patent Application Laid-Open No. 2010-219324).

SUMMARY OF THE INVENTION

In some cases, a light-emitting device is required not only to emit high-intensity light (i.e., to have high output), but also to have a clear boundary between light and dark (i.e., to exhibit high contrast). In this case, the light-emitting device is required to be configured so as to emit high-output light from a specific region and not to emit light from other regions.

The present invention has been made in view of the above-mentioned circumstances, and an object thereof is to provide a light-emitting device achieving high output and high contrast with a simple configuration.

The light-emitting device according to the present invention includes: a substrate; a light-emitting element disposed on the substrate; a light transmitting member disposed on the light-emitting element; and a covering body that is disposed on the substrate, covers a side surface of the light transmitting member and has an upper surface exposed to the outside, wherein the covering body has a particle group composed of a plurality of particles dispersed in the covering body, and the particle group includes a plurality of titanium oxide particles or zinc oxide particles dispersed in a vicinity of the upper surface of the covering body and having a portion having a narrower band gap than that in other portions in each particle.

The light-emitting device according to the present invention includes: a substrate; a light-emitting element disposed on the substrate; and a covering body that is disposed on the substrate, covers a side surface of the light-emitting element and has an upper surface exposed to the outside, wherein the covering body has a particle group composed of a plurality of particles dispersed in the covering body, and the particle group includes a plurality of titanium oxide particles or zinc oxide particles dispersed in the vicinity of the upper surface of the covering body and having a portion having a narrower band gap than that in other portions in each particle.

DETAILED DESCRIPTION OF THE INVENTION

Hereinafter, embodiments of the present invention will be described in detail.

First Embodiment

Figure 1A:
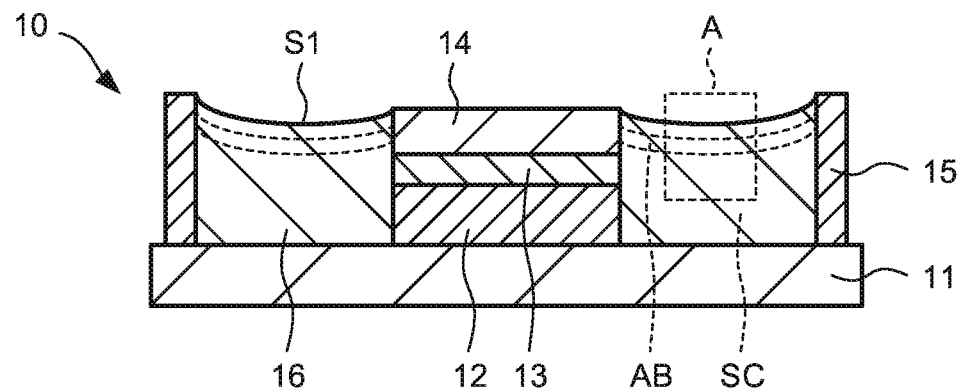
FIG. 1A is a cross-sectional view of a light-emitting device according to a first embodiment.
Figure 1B:
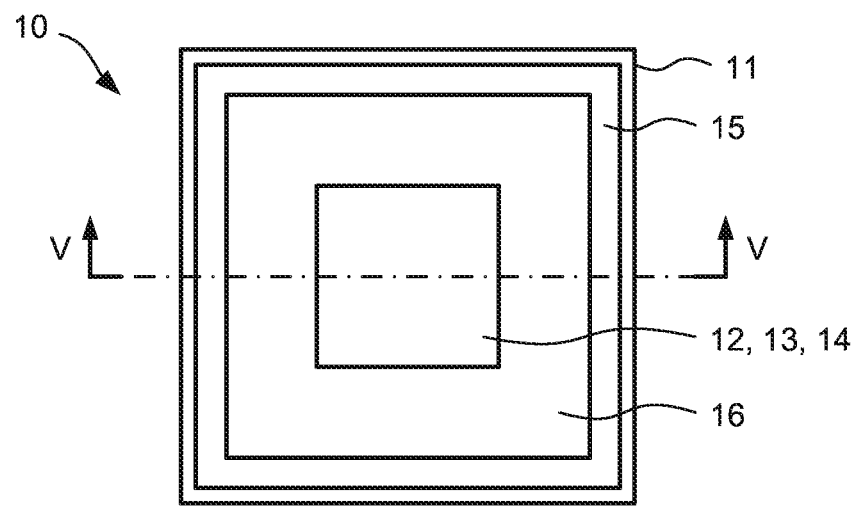
FIG. 1B is a top view of the light-emitting device according to the first embodiment.
Figure 1C:
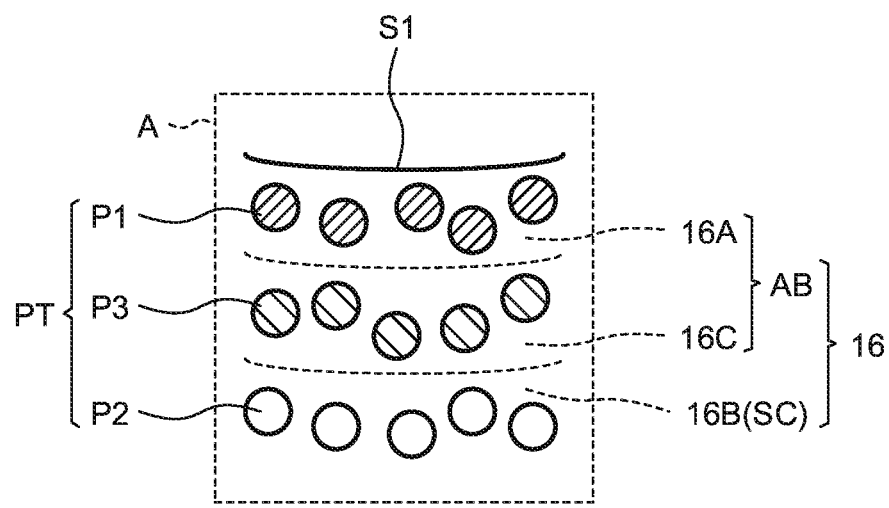
FIG. 1C is an enlarged cross-sectional view of the light-emitting device according to the first embodiment.

FIG. 1A is a cross-sectional view of a light-emitting device 10 according to a first embodiment. FIG. 1B is a schematic top view of the light-emitting device 10. FIG. 1A is a cross-sectional view taken along line V-V of FIG. 1B. FIG. 1C is an enlarged cross-sectional view showing a part A surrounded by a broken line in FIG. 1A in an enlarged manner. The configuration of the light-emitting device 10 will be described with reference to FIGS. 1A to 1C.

The light-emitting device 10 includes a substrate 11, a light-emitting element 12 mounted on the substrate 11, a translucent member 13 disposed on the light-emitting element 12, and a light transmitting member 14 disposed on the translucent member 13. In addition, the light-emitting device 10 has a frame body 15 arranged on the substrate 11 so as to surround each of the light-emitting element 12, the translucent member 13, and the light transmitting member 14 apart from each of the light-emitting element 12, the translucent member 13, and the light transmitting member 14.

In addition, the light-emitting device 10 includes a covering body 16 formed on the substrate 11 and covering the side surfaces (or the side walls) of the light-emitting element 12, the translucent member 13, and the light transmitting member 14. The covering body 16 has an upper surface S1 exposed to the outside. In addition, in the vicinity of the upper surface S1 of the covering body 16, there are disposed particles that absorb light that has entered the covering body 16 from the side surface of the light transmitting member 14 and is output to the outside from the upper surface S1 of the covering body 16. The covering body 16 will be described in greater detail below.

In the present embodiment, the substrate 11 is a mounting substrate having a wiring for supplying power to the light-emitting element 12. The substrate 11 has a mounting surface of the light-emitting element 12, and has a first wiring and a second wiring formed on the mounting surface and electrically insulated from each other. In addition, the substrate 11 has a first external electrode and a second external electrode formed on a surface (back surface) opposite to the mounting surface and electrically connected to the first wiring and the second wiring, respectively. The light-emitting element 12 is mounted on the substrate 11 and connected to the wirings on the substrate 11.

The light-emitting element 12 is a semiconductor light-emitting element such as a light-emitting diode, for example. In the present embodiment, the light-emitting element 12 includes a semiconductor layer (not shown) formed of a nitride-based semiconductor. The light-emitting element 12 emits light in, for example, a blue region (wavelength of 420 to 470 nm) (hereinafter, sometimes referred to as blue light).

In this embodiment, the light-emitting element 12 includes a supporting substrate (for example, a silicon substrate), a semiconductor layer bonded to a first main surface of the supporting substrate, a first electrode formed on the first main surface of the supporting substrate, and a second electrode formed on a second main surface of the supporting substrate opposite to the first main surface and having a polarity different from that of the first electrode. Note that the first electrode may be formed on the semiconductor layer bonded to the first main surface of the supporting substrate.

The second electrode of the light-emitting element 12 is electrically connected to the second wiring of the substrate 11 via a conductive bonding member. The first electrode of the light-emitting element 12 is electrically connected to the first wiring of the substrate 11 via a gold wire.

Note that the configuration of the light-emitting element 12 on the substrate 11 is not limited to this configuration. For example, as the light-emitting element 12 having another configuration, may be mentioned a light-emitting element (hereinafter, referred to as a light-emitting element 12A) having a growth substrate, a semiconductor layer grown on the growth substrate, and a first electrode and a second electrode formed on the semiconductor layer.

The light-emitting element 12A can be bonded to the substrate 11 by bonding the surface of the growth substrate on the opposite side to the semiconductor layer to the mounting surface of the substrate 11, for example, with a bonding member. The first electrode and the second electrode of the light-emitting element 12 can be bonded to the first wiring and the second wiring of the substrate 11, respectively, via a gold wire. When the light-emitting element 12A is mounted on the substrate 11, the growth substrate is disposed on the substrate 11, and the semiconductor layer is disposed on the growth substrate.

As another configuration of the light-emitting element 12, may be mentioned a case where the semiconductor layer of the light-emitting element 12A is bonded to the mounting surface of the substrate 11 (flip-chip bonding, hereinafter, referred to as a light-emitting element 12B). In this case, the first electrode and the second electrode of the light-emitting element 12B can be bonded to the first wiring and the second wiring of the substrate 11 by a conductive bonding member. When the light-emitting element 12B is mounted on the substrate 11, the semiconductor layer is disposed on the substrate 11, and the growth substrate is disposed on the semiconductor layer.

In the present embodiment, a case where the light-emitting element 12 has a rectangular upper surface shape (regular square shape in this embodiment) when viewed from a direction perpendicular to the mounting surface of the light-emitting element 12 on the substrate 11 will be described. However, the shape of the upper surface of the light-emitting element 12 is not limited to a rectangular shape, and various shapes such as a circular shape, an elliptical shape, and a long rectangular shape may be adopted. In this embodiment, the upper surface of the light-emitting element 12 functions as a light extraction surface of the light-emitting element 12.

The translucent member 13 is a member that transmits the light emitted from the light-emitting element 12, and is formed of, for example, a member that transmits at least visible light. For example, an epoxy resin, a silicone resin, a low melting point glass, or the like may be used as the material for the translucent member 13.

The translucent member 13 may include a wavelength converter, for example, a phosphor, for converting the wavelength of the light emitted from the light-emitting element 12. For example, as the phosphor, a green phosphor that converts blue light into green light, a yellow phosphor that converts blue light into yellow light, a red phosphor that converts blue light into red light, or the like can be used.

The configuration of the translucent member 13 is not limited to this. For example, the translucent member 13 may be composed of a nanoparticle sintered body of a metal oxide that transmits light emitted from the light-emitting element 12 and light converted by a phosphor. In addition, the light-emitting device 10 does not need to have the translucent member 13.

The light transmitting member 14 is disposed on the upper surface of the translucent member 13. The light transmitting member 14 is a member that transmits the light emitted from the light-emitting element 12 and/or the light converted by the wavelength converter, and is formed of, for example, a member that transmits at least visible light. For example, a glass plate, a sapphire plate, a YAG (Yttrium Aluminum Garnet) plate, or the like can be used as the light transmitting member 14.

The light transmitting member 14 may include a wavelength converter, for example, a phosphor, for converting the wavelength of the light emitted from the light-emitting element 12. For example, as the phosphor, a green phosphor that converts blue light into green light, a yellow phosphor that converts blue light into yellow light, a red phosphor that converts blue light into red light, or the like can be used.

The configuration of the light transmitting member 14 is not limited to this. For example, the light transmitting member 14 may be composed of a nanoparticle sintered body of an acrylic resin, a silicone resin, a fluorine resin, or a metal oxide that transmits the light emitted from the light-emitting element 12 and the light converted by the wavelength converter.

The upper surface of the light transmitting member 14 functions as a light extraction surface of the light-emitting device 10. In the present embodiment, the upper surface of the light transmitting member 14 has a shape similar to that of the upper surface of the light-emitting element 12, for example, a rectangular shape. However, the shape of the upper surface of the light transmitting member 14 is not limited to a rectangular shape, and may be a shape different from the shape of the upper surface of the light-emitting element 12. Further, for example, the side surface of the light transmitting member 14 may be formed in a stepped shape, or may be inclined with respect to the upper surface.

The frame body 15 is disposed on the substrate 11 so as to surround each of the light-emitting element 12, the light transmitting member 13, and the light transmitting member 14 apart from each of the light-emitting element 12, the light transmitting member 13, and the light transmitting member 14. The frame body 15 may be disposed so as to surround the outer periphery of the substrate 11. The frame body 15 may not be provided, and the outer side surface of the covering body 16 may be exposed.

In the present embodiment, the frame body 15 is formed integrally with the substrate 11, and an alumina molded body (hereinafter, referred to as lamp house) having a concave portion for accommodating the light-emitting element 12 is used as the substrate 11 and the frame body 15.

The covering body 16 is formed on the substrate 11 in a region outside the light-emitting element 12, the translucent member 13, and the light transmitting member 14 and surrounded by the frame body 15. That is, in the present embodiment, the frame body 15 defines the position of the outer edge (outer periphery) of the covering body 16 on the substrate 11.

Hereinafter, the covering body 16 will be described in detail. The covering body 16 has the upper surface S1 exposed to the outside. Specifically, the covering body 16 is continuously disposed on the substrate 11 from the end of the upper surface (i.e., the light extraction surface) of the light transmitting member 14 to the inner end of the upper surface (the surface opposite to the substrate 11) of the frame body 15. The covering body 16 is provided in an annular shape so as to surround the side surface of the light transmitting member 14.

The covering body 16 has a bottom surface in contact with the substrate 11, an inner side surface in contact with the side surface of the light transmitting member 14, an outer side surface in contact with the inner surface of the frame body 15, and the upper surface S1 provided on the side opposite to the bottom surface and exposed to the outside.

In this embodiment, a case where the covering body 16 is in contact with the entire side surface of the light transmitting member 14 will be described. However, the covering body 16 may be in contact with only a part of the side surface of the light transmitting member 14. For example, the covering body 16 may cover only the partial side surface of the light transmitting member 14 (i.e., the upper region of the side surface of the light transmitting member 14) from the end portion of the upper surface (light extraction surface) of the light transmitting member 14 toward the bottom surface of the light transmitting member 14 (the surface through which light from the light-emitting element 12 and the translucent member 13 enters).

In the present embodiment, a case where the covering body 16 is in contact with the entire inner surface of the frame body 15 will be described. However, the covering body 16 may be in contact with only a part of the inner surface of the frame body 15. For example, the covering body 16 may cover only a partial region from the upper end to the lower end of the inner surface of the frame body 15 (that is, an upper region of the inner surface of the frame body 15).

Further, in the present embodiment, the upper surface of the frame body 15 is configured to be higher in position from the substrate 11 than the upper surface of the light transmitting member 14. Therefore, the covering body 16 is disposed in such a manner that the outer side surface thereof is higher than the inner side surface thereof. In the present embodiment, the covering body 16 includes a thermosetting resin as described later. Therefore, the upper surface S1 of the covering body 16 has a shape slightly recessed toward the substrate 11 due to heat shrinkage after curing. Note that the upper surface of the frame body 15 may be disposed at a position flush with the upper surface of the light transmitting member 14.

Next, the inner structure of the covering body 16 will be described with reference to FIGS. 1C and 1D. First, as shown in FIG. 1C, the covering body 16 has a particle group PT including a plurality of titanium oxide particles (first, second and third titanium oxide particles P1, P2 and P3 are shown in FIG. 1C) dispersed in the covering body 16.

In this embodiment, the covering body 16 includes a medium (matrix) in which the particle group PT is dispersed. Examples of the medium include a thermosetting silicone resin and an epoxy resin. That is, the covering body 16 is formed of a resin body containing particles. In the present embodiment, the resin body as the medium has a characteristic of capable of transmitting visible light.

In the present embodiment, the covering body 16 functions as a sealing body for sealing the light-emitting element 12 and other functional elements (such as a Zener diode for stabilizing the voltage applied to the light-emitting element 12), wirings, and the like on the substrate 11.

Figure 1D:
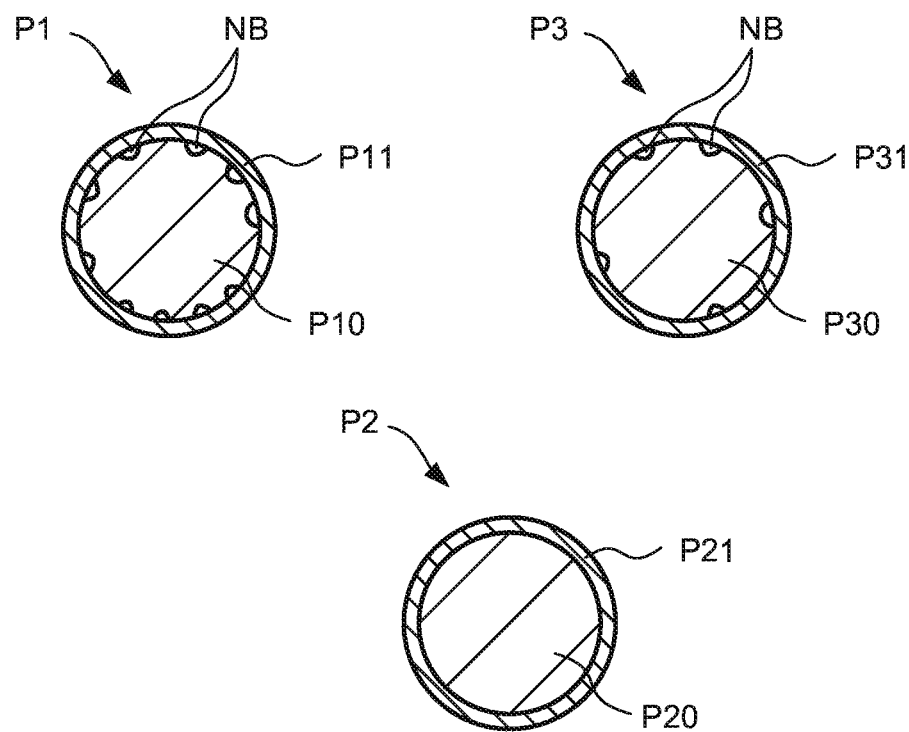
FIG. 1D is a cross-sectional view of particles in the covering body of the light-emitting device according to the first embodiment.

As shown in FIG. 1D, the respective first to third titanium oxide particles P1 to P3 have particle bodies P10, P20, and P30, and coating films P11, P21, and P31 covering the particle bodies P10, P20, and P30, respectively.

Specifically, in the present embodiment, the first titanium oxide particle P1 has the particle body P10 (a portion made of titanium oxide) and the coating film P11 that covers the surface of the particle body P10 and protects the particle body P10. The coating film P11 is a film formed of alumina, silica, or an organic substance such as polyol, for example. Similarly, the second and third titanium oxide particles P2 and P3 have the particle bodies P20 and P30 and the coating films P21 and P31 covering the surfaces of the particle bodies P20 and P30, respectively.

Next, as shown in FIG. 1D, each of the first and third titanium oxide particles P1 and P3 in the particle group PT has a portion NB having a narrower band gap than that in other portions in each particle (in each of the particle bodies P10 and P30).

Also, as shown in FIG. 1C, in the present embodiment, the particle group PT includes the first to third titanium oxide particles P1 to P3 dispersed so that the density of the narrower band gap portion NB in each particle is lowered from the upper surface S1 of the covering body 16 toward the substrate 11. For the sake of clarity of the drawing, the first and third titanium oxide particles P1 and P3 are hatched in FIG. 1C. In this embodiment, each of the titanium oxide particles P1 to P3 is formed of titanium dioxide ($TiO_2$) having a rutile-type crystalline structure.

The density of the narrower band gap portion NB in each of the first to third titanium oxide particles P1 to P3 is, for example, a ratio of a portion occupied by the narrower band gap portion NB in each particle, and is, for example, the area occupied by the narrower band gap portion NB on the surface of each of the particle bodies P10 to P30.

In the present embodiment, in the first titanium oxide particles P1 dispersed in the region closest to the upper surface S1 of the particle group PT, the density of the portion NB having the narrower band gap than that in other portions in the first titanium oxide particle P1 is highest (the portion NB having the narrower band gap at the first density).

For example, the narrower band gap portion NB of the first titanium oxide particle P1 has a band gap energy smaller than the energy of visible light (in particular, the energy of the wavelength of visible light). For example, the narrower band gap portion NB of the first titanium oxide particle P1 has a band gap energy (e.g., about 1.5 eV) smaller than the energy of the light emitted from the light-emitting element 12 (blue light in this embodiment) and the light emitted from the translucent member 13 (blue light and yellow light in this embodiment).

In the second titanium oxide particles P2 dispersed in the region closest to the substrate 11 in the particle group PT, the density of the narrow band gap portion NB in the second titanium oxide particle P2 is lowest (the narrower band gap portion NB at the second density).

For example, the second titanium oxide particles P2 have almost no narrower band gap portion NB, as shown in FIG. 1D. Thus, for example, the second titanium oxide particles P2 have a band gap energy greater than the energy of the emitted light from the light-emitting element 12 in any part (almost entirely).

For example, when the second titanium oxide particle P2 has a rutile-type crystal structure, the second titanium oxide particle P2 has a band gap energy of 3.0 eV. When the second titanium oxide particle P2 has an anatase-type crystal structure, the second titanium oxide particle P2 has a band gap energy of 3.2 eV.

In the third titanium oxide particles P3 dispersed between the first and second titanium oxide particles P1 and P2 in the particle group PT, the narrower band gap portion NB (a portion having a band gap energy of, for example, 1.5 eV) in the third titanium oxide particle P3 is provided at a density (a third density (a density between the first density and the second density)) between the first titanium oxide particle P1 and the second titanium oxide particle P2.

Note that it is understood that the band gap of the crystal of titanium oxide is narrowed by oxygen deficiency. More specifically, an intermediate level is formed between the valence band and the conduction band of titanium oxide due to oxygen deficiency. Here, the band gap is an energy gap between the intermediate level and the valence band or the conduction band. Therefore, for example, it is understood that the narrower band gap portion NB in the first or third titanium oxide particles P1 or P3 is a portion in which oxygen deficiency occurs in the crystal of titanium oxide.

Here, the band gaps in the first to third titanium oxide particles P1 to P3 (i.e., local band gaps in the respective particles) will be described. A crystal having a band gap has an optical characteristic of absorbing light having a wavelength whose energy is larger than the band gap energy and transmitting light having a wavelength whose energy is smaller than the band gap energy.

In the present embodiment, the narrower band gap portion NB in each of the first and third titanium oxide particles P1 and P3 has a band gap energy smaller than the band gap energy corresponding to the wavelength of visible light. Accordingly, each of the first and third titanium oxide particles P1 and P3 absorbs visible light by the narrower band gap portion NB. Therefore, in the present embodiment, the first and third titanium oxide particles P1 and P3 exhibit black or gray because visible light is absorbed under observation using white visible light.

In this embodiment, since each of the second titanium oxide particles P2 does not (substantially does not) have a narrower band gap portion NB, visible light is transmitted and scattered. Therefore, in this embodiment, each of the second titanium oxide particles P2 exhibits white under observation using white visible light.

Further, in the present embodiment, when the regions in which the first, second, and third titanium oxide particles P1, P2, and P3 are dispersed in the covering body 16 are referred to as the first, second, and third dispersion regions (or the first, second, and third particle layers) 16A, 16B, and 16C, respectively, the first and third dispersion regions 16A and 16C function as visible light absorption regions (hereinafter, simply referred to as absorption regions) AB that absorb visible light. On the other hand, the second dispersion region 16B functions as a visible light scattering reflection region (hereinafter, simply referred to as a scattering reflection region) SC for scattering and reflecting visible light.

The first and third titanium oxide particles P1 and P3 are dispersed only in a region near the upper surface S1 of the covering body 16. For example, the first and third titanium oxide particles P1 and P3 are dispersed only in a region within a depth range of 20 μm or less from the upper surface S1. Therefore, the covering body 16 functions as an absorption region AB in the vicinity of the upper surface S1, and functions as a scattering reflection region SC in the inside thereof.

In the present embodiment, the first to third titanium oxide particles P1 to P3 are dispersed in the covering body 16 (in the medium) with a uniform dispersion density as a whole. However, the first to third titanium oxide particles P1 to P3 may be dispersed so that the dispersion density (contained amount) gradually increases from the upper surface S1 of the covering body 16 toward the substrate 11. For example, the dispersion density of the second titanium oxide particles P2 in the second dispersion region 16B may be higher than the dispersion density of the first titanium oxide particles P1 in the first dispersion region 16A.

The first, second, and third titanium oxide particles P1, P2, and P3 have the coating films P11, P21, and P31, respectively, so that the first to third titanium oxide particles P1 to P3 have resistance to yellowing by ultraviolet rays (yellowing resistance) and weather resistance.

Note that when resistance to yellowing by ultraviolet rays or weather resistance is not required, the first to third titanium oxide particles P1 to P3 may not have the coating films P11 to P31. For example, when the absorption region AB is formed in the vicinity of the upper surface S1 of the covering body 16, ultraviolet rays can be absorbed by the absorption region AB. Therefore, in this case, the respective first to third titanium oxide particles P1 to P3 do not need to have the coating films P11 to P31.

Figure 2A:
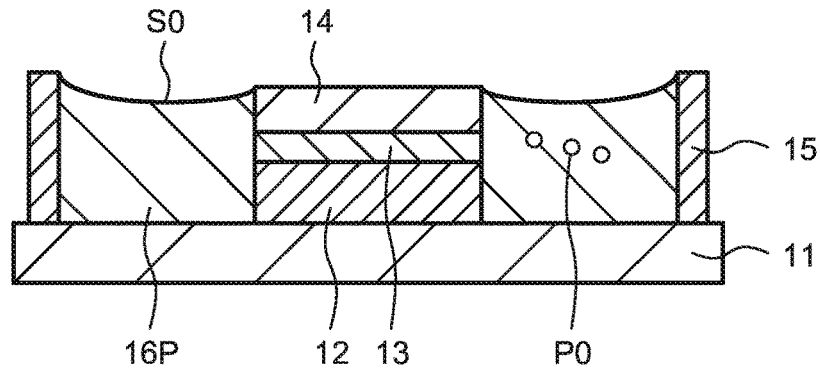
FIG. 2A is a diagram showing a producing method of the light-emitting device according to the first embodiment.
Figure 2B:
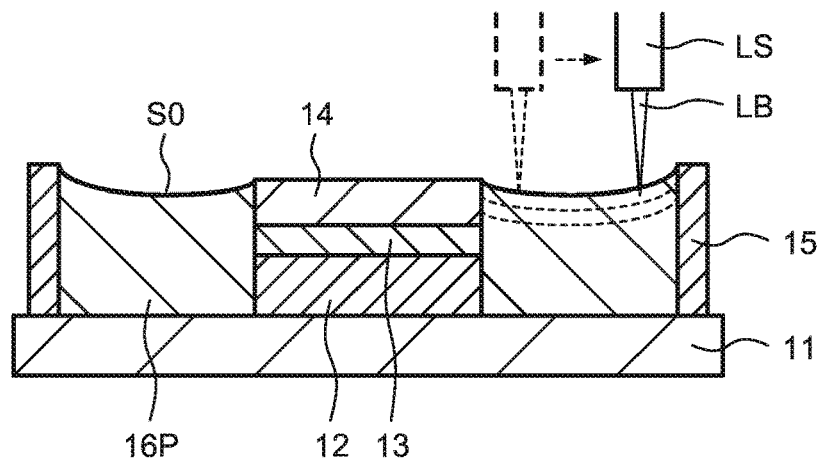
FIG. 2B is a diagram showing a producing method of the light-emitting device according to the first embodiment.
Figure 2C:
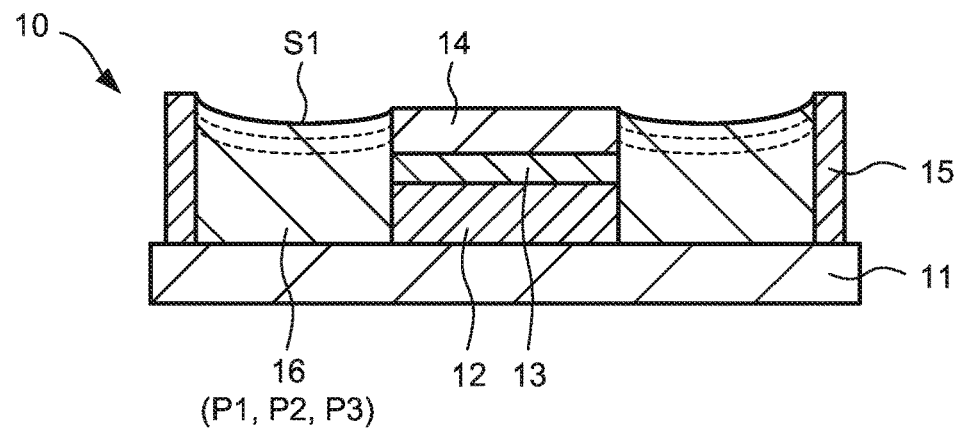
FIG. 2C is a diagram showing a producing method of the light-emitting device according to the first embodiment.

FIG. 2A, FIG. 2B, and FIG. 2C are diagrams showing respective steps of a producing method of the light-emitting device 10. Each of FIGS. 2A to 2C is a cross-sectional view similar to that of FIG. 1A in each step. The method of producing the light-emitting device 10 will be described with reference to FIGS. 2A to 2C.

First, FIG. 2A shows the substrate 11 on which the light-emitting element 12, the translucent member 13, the light transmitting member 14, the frame body 15, and a particle-containing resin 16P are formed. In this embodiment, first, a lamp house in which the frame body 15 is bonded to the substrate 11 is prepared (step 1). Next, the light-emitting element 12 is disposed on the substrate 11 and bonded thereto (step 2). Next, the light transmitting member 14 (glass plate) is adhered onto the light-emitting element 12 via the translucent member 13 containing a yellow phosphor (step 3).

Next, a silicone resin containing the same titanium oxide particles P0 as the third titanium oxide particles P3 is filled as the particle-containing resin 16P in the region between the light transmitting member 14 and the frame body 15 on the substrate 11 (step 4). Then, the particle-containing resin 16P is heated and cured (step 5). In this embodiment, rutile-type titanium dioxide having an average particle diameter of 250 nm and a band gap energy of 3.0 eV was used as the titanium oxide particles P0. As the resin medium of the particle-containing resin 16P, a silicone resin was used. The concentration of the titanium oxide particles P0 in the particle-containing resin 16P was 16 wt %.

FIG. 2B is a diagram showing the upper surface of the particle-containing resin 16P when the upper surface S0 of the particle-containing resin 16P is being irradiated with the laser beam. After the particle-containing resin 16P has been cured, the upper surface S0 of the particle-containing resin 16P exposed to the outside in between the light-emitting element 12 and the frame body 15 is irradiated with the laser beam LB (step 6).

In this embodiment, a laser light source LS for emitting laser beam LB having a wavelength of 355 nm was prepared. Then, the laser beam LB having a beam diameter of $\varphi$45 µm and a power of 50 kW/cm$^2$ was irradiated onto the upper surface S0 of the particle-containing resin 16P while scanning the particle-containing resin 16P at a rate of 1000 mm/sec. The energy of light having a wavelength of 355 nm is about 3.5 eV, and the band gap energy of rutile-type titanium dioxide is 3.0 eV. Therefore, the energy of the laser beam LB is larger than the band gap energy of the titanium oxide particles P0. Therefore, the laser beam LB is absorbed by the titanium oxide particles P0.

As a result, oxygen atoms are desorbed from the titanium oxide particles P0 irradiated with the laser beam LB. In addition, by adjusting the irradiation intensity, the irradiation time, the focal position, and the like of the laser beam LB, the laser beam LB is irradiated only to the titanium oxide particles P0 in the vicinity of the upper surface S0. Therefore, the titanium oxide particles having the largest oxygen deficiency are generated in the vicinity of the upper surface S0 of the particle-containing resin 16P, and the degree of the alteration (oxygen deficiency) of the titanium oxide particle P0 decreases as it is apart from the upper surface S0.

As a result, the titanium oxide particles P0 having much oxygen deficiency present in the vicinity of the upper surface S0 of the particle-containing resin 16P become the first titanium oxide particles P1 having a narrower band gap portion NB with a high density. Then, the titanium oxide particles P0 apart from the upper surface S0 of the particle-containing resin 16P become the third titanium oxide particles P3 in which the narrower band gap portion NB is relatively small.

Also, when the titanium oxide particles P0 are apart from the upper surface S0 by a predetermined distance (the distance at which the laser beam LB is shielded by the titanium oxide particle), the titanium oxide particles P0 existing there are not affected by laser irradiation and maintain its characteristics. Therefore, the titanium oxide particles P0 present in the vicinity of the substrate 11 become the second titanium oxide particles P2 having almost no narrower band gap portion NB. In this manner, the covering body 16 including a plurality of titanium oxide particles (particle group PT) dispersed such that the density of the portion NB having a narrower band gap than that in other portions in each particle is gradually lowered, and the light-emitting device 10 including the same can be produced by irradiating the laser beam (see FIG. 2C).

In the step of irradiating the laser beam LB (step 6), it is preferable to adjust the laser light source LS and the laser beam LB so as not to alter other materials, for example, the medium of the covering body 16 (for example, silicone resin), the translucent member 13, the light transmitting member 14, and the like. For example, by irradiating the laser beam LB under the above-described conditions, only the titanium oxide particles P0 can be altered while suppressing alteration of other materials.

The inventors of the present application have confirmed that the laser beam LB under the conditions (and the power in the range of 25 to 75 kW/cm$^2$) does not alter the silicone resin as the medium of the covering body 16, the translucent member 13 and the phosphor in the translucent member 13, and the glass plate as the light transmitting member 14. In this embodiment, a silicone resin having a transmittance of 60% or more with respect to light having a wavelength of 355 nm was used as the medium of the covering body 16.

The method of producing the light-emitting device 10 is not limited to this. For example, after the particle-containing resin 16P is applied and left to stand for a predetermined time, the titanium oxide particles P0 are precipitated by heating the particle-containing resin 16P. As a result, it is also possible to form the covering body 16 in which the dispersion density of the titanium oxide particles P0 on the upper surface S1 side is lowered.

Figure 3:
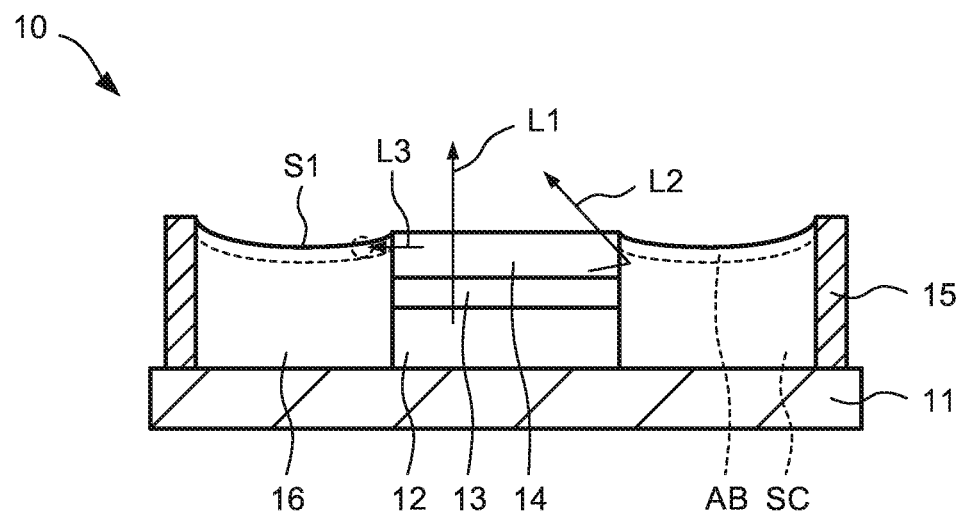
FIG. 3 is a diagram schematically showing a light path in the light-emitting device according to the first embodiment.

FIG. 3 is a diagram schematically showing a light path in the light-emitting device 10. First, almost all of the light emitted from the light-emitting element 12 passes through the translucent member 13 and the light transmitting member 14 as in the light L1, and is extracted to the outside from the upper surface (light extraction surface) of the light transmitting member 14.

Next, light entering the scattering reflection region SC of the covering body 16 from the side surface of the light transmitting member 14 (such as light L2) is reflected by the scattering reflection region SC and returns to the light transmitting member 14. Light such as the light L2 is extracted from the upper surface of the light transmitting member 14 to the outside.

On the other hand, light entering the absorption region AB of the covering body 16 from the side surface of the light transmitting member 14 (such as light L3) is absorbed by the absorption region AB. In addition, even when light such as the light L3 is not completely absorbed in the absorption region AB, the light is sufficiently attenuated. Therefore, there is little light extracted from the upper surface S1 of the covering body 16.

Therefore, when the light extraction surface of the light-emitting device 10 is observed, almost no light is extracted from a region other than the upper surface of the light transmitting member 14. Therefore, the bright and dark areas are clearly separated between the region of the light transmitting member 14 and the region other than the region, so that it is possible to obtain output light of high contrast. In addition, light incident on the covering body 16 from the outside, such as stray light, is also absorbed or attenuated by the absorption region AB of the covering body 16. Therefore, high contrast is maintained as the light-emitting device 10.

In addition, the covering body 16 has high reflectivity for most of the light incident on the covering body 16 from the sides of the light-emitting element 12, the translucent member 13, and the light transmitting member 14, and has absorptivity for the light incident on the covering body 16 from the outside. Therefore, the light-emitting device 10 can output light of high contrast without sacrificing a decrease in light output.

In addition, the absorption region AB of the covering body 16 can be easily formed by simply adding the irradiation step (step 6) of the laser beam LB. Therefore, it is possible to easily provide the light-emitting device 10 achieving high output and high contrast.

Figure 4:
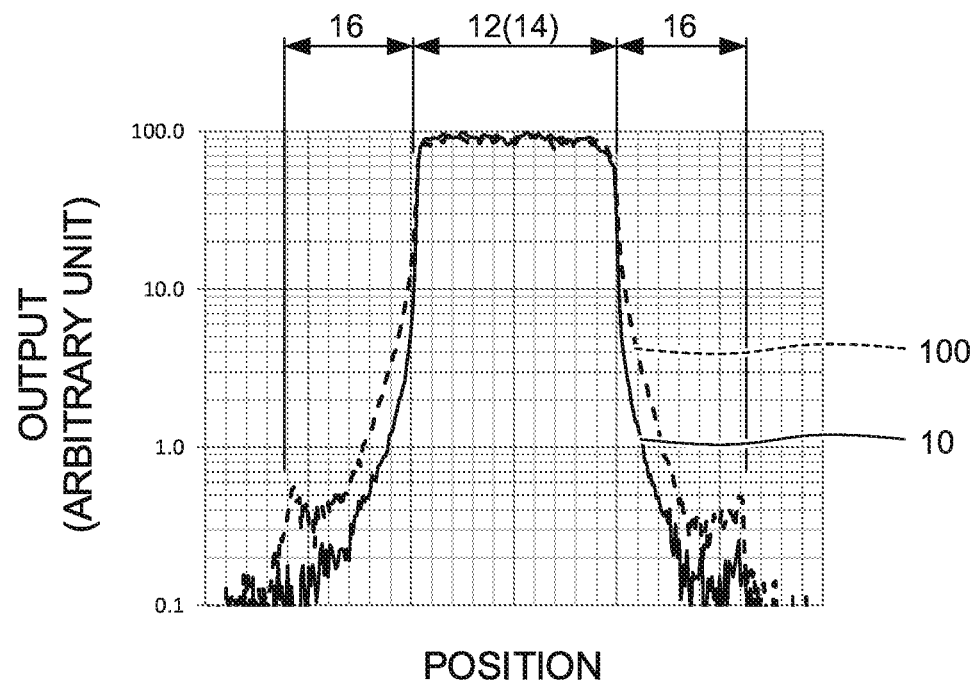
FIG. 4 is a diagram showing light output from the light-emitting device according to the first embodiment.

FIG. 4 is a diagram showing a distribution of light output from the light-emitting device 10. In FIG. 4, the horizontal axis represents the position of the light-emitting device 10 along the line V-V in FIG. 1B, and the vertical axis represents the light output (the value obtained by normalizing the luminance with the maximum value). In order to confirm the effect of the light-emitting device 10, as a comparative example, a light-emitting device 100 in which the covering body 16 was formed of a resin body containing uniform titanium oxide particles was measured for its output in a similar manner as that for the light-emitting device 10. In FIG. 4, the output measurement result of the light-emitting device 10 is shown by a solid line, and the output measurement result of the light-emitting device 100 is shown by a broken line. Note that the maximum luminance of the light-emitting elements 10 and 100 was the same.

As shown in FIG. 4, it can be understood that the output from a region other than the region of the light transmitting member 14 (the light-emitting element 12) in the light-emitting device 10 is greatly suppressed as compared to the light-emitting device 100. On the other hand, the output from the region of the light transmitting member 14 in the light-emitting device 10 is approximately the same as that of the light-emitting device 100. That is, it can be understood that the light-emitting device 10 achieves high contrast without lowering the output.

In the present embodiment, the resin body as the dispersion medium of the particle group PT is integrally formed. That is, for example, each of the first to third titanium oxide particles P1 to P3 in the covering body 16 is dispersed in the same medium. In addition, there is no medium boundary between the first to third dispersion regions 16A to 16C. Therefore, even when the absorption region AB is provided, the mechanical strength of the covering body 16 is maintained, and the optical function is stabilized as described above. Thus, the covering body 16 and the light-emitting device 10 are of high quality and have long life.

Further, in the present embodiment, the particle group PT has a uniform dispersion density as a whole in the covering body 16. Accordingly, each of the first to third titanium oxide particles P1 to P3 is dispersed in the covering body 16 at a density within the same degree as each other. Therefore, even in the case where the absorption region AB is provided, the thermal expansion coefficient of the covering body 16 as a whole is made uniform, thereby maintaining the mechanical strength of the covering body 16. Thus, the covering body 16 and the light-emitting device 10 are of high quality and have long life.

For example, as described above, when the dispersion density of the second titanium oxide particles P2 on the substrate 11 side is increased and the dispersion density of the first titanium oxide particles P1 on the upper surface S1 side is decreased, resin cracking of the upper surface S1 of the covering body 16 can be prevented.

In the present embodiment, the covering body 16 includes a thermosetting epoxy resin or silicone resin having a refractive index in the range of 1.4 to 1.55 as a resin medium. The particle group PT includes, for example, anatase-type titanium oxide particles having a refractive index of about 2.5 or rutile-type titanium oxide particles having a refractive index of about 2.7. In consideration of scattering light in the covering body 16, it is preferable that the particle group PT (in particular, the second titanium oxide particle P2) have a higher refractive index than that of the resin medium.

In consideration of obtaining good diffusion and reflection characteristics, the particle diameter (average particle diameter) of each of the first to third titanium oxide particles P1 to P3 in the particle group PT of the covering body 16 is preferably in the range of 150 to 350 nm. Further, when the average particle diameter of the first to third titanium oxide particles P1 to P3 is set within the range of about 1 to ¼ with respect to the wavelength of the light (visible light) that has entered the covering body 16 (for example, the wavelength in the medium of the silicone resin), Mie scattering with a high backscattering ratio can be generated, and extremely favorable diffusion and reflection characteristics can be achieved. When the average particle diameter of the particles in the particle group PT is adjusted in consideration of these factors, the reflectance in the scattering reflection region SC can be enhanced. Also in the absorption region AB, light scattering causes light to be taken into particles with high probability and absorbed, so that the absorptance can be increased.

The concentration of the particle group PT in the covering body 16 is preferably in the range of 5 to 70 wt % in consideration of obtaining desired light reflectivity and light absorption properties, and is more preferably in the range of 8 to 30 wt % in consideration of ease of production (ease of application of the particle-containing resin 16P) and production cost. Note that the above-described particle group PT and medium configuration of the covering body 16 are merely examples.

Further, as shown in FIG. 1D, since the respective first to third titanium oxide particles P1 to P3 have the coating films P11 to P31 (i.e., the titanium oxide particles P0 used for forming each particle have the coating film), oxygen deficiency can be effectively and stably generated on the surfaces of the particle bodies P10 to P30 by using high-power laser having a wavelength of 355 nm in the step (step 6) of irradiating the laser beam LB at the time of producing the light-emitting device 10. In particular, when a coating film is provided for the purpose of imparting yellowing resistance (resistance to ultraviolet rays) to each particle, the absorption region AB can be stably formed only in a thin region of several μm from the upper surface S1 of the covering body 16.

When the particle diameter of the titanium oxide particles P0 is substantially equal to the wavelength of the laser beam LB in the particle-containing resin 16P, Mie scattering having a large backscattering ratio is generated by the titanium oxide particles P0 in the region in the particle-containing resin 16P. As a result, the laser beam LB is scattered and reflected in the vicinity of the upper surface S0 of the particle-containing resin 16P, and as a result, the absorption region AB can be formed only in a thin region of several μm to 20 μm in the vicinity of the upper surface S1 of the covering body 16.

When light at a wavelength whose energy is higher than the band gap energy of the titanium oxide particles P0 in the particle-containing resin 16P is adopted as the laser beam LB, the laser beam LB can be absorbed by the titanium oxide particles P0. Therefore, the absorption region AB can be formed only in a thin region of several μm to 20 μm in the vicinity of the upper surface S1 of the covering body 16.

Figure 5A:
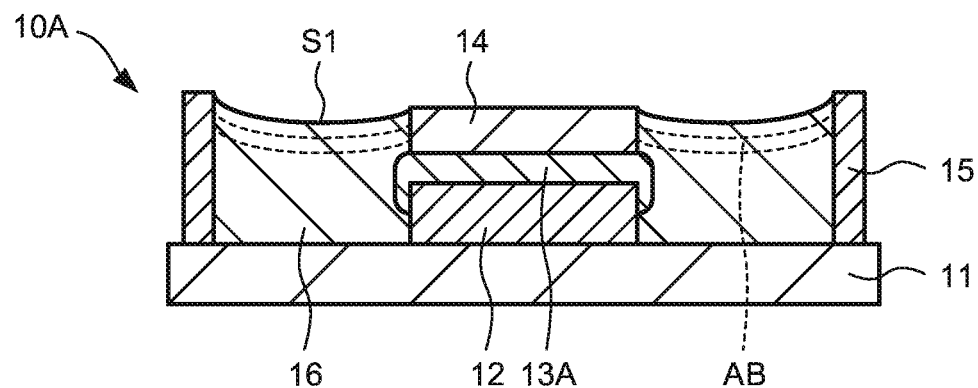
FIG. 5A is a cross-sectional view of a light-emitting device according to a first modification of the first embodiment.

FIG. 5A is a cross-sectional view of a light-emitting device 10A according to a first modification of the first embodiment. The light-emitting device 10A has the same configuration as that of the light-emitting device 10 except for the configuration of a translucent member 13A. In the present modification, the translucent member 13A covers a part of the side surface of the light-emitting element 12. That is, the translucent member 13A is formed on the upper surface and the side surface of the light-emitting element 12. In the present modification, the covering body 16 is in contact with the light-emitting element 12 in the lower region of the side surface of the light-emitting element 12, and covers the light-emitting element 12 via the translucent member 13A in the upper region thereof.

In the light-emitting device 10A, the covering body 16 has a portion that is not in contact with the side surface of the light-emitting element 12 at an upper region of the side surface of the light-emitting element 12. When the covering body 16 is configured in this manner, the light emitted from the side surface of the light-emitting element 12 can be guided by the light transmitting member 13A to be incident on the outer edge portion of the light transmitting member 14. Accordingly, it is possible to increase the light extracted from the outer edge portion of the light transmitting member 14. Therefore, the light-emitting device 10A achieves high contrast.

Figure 5B:
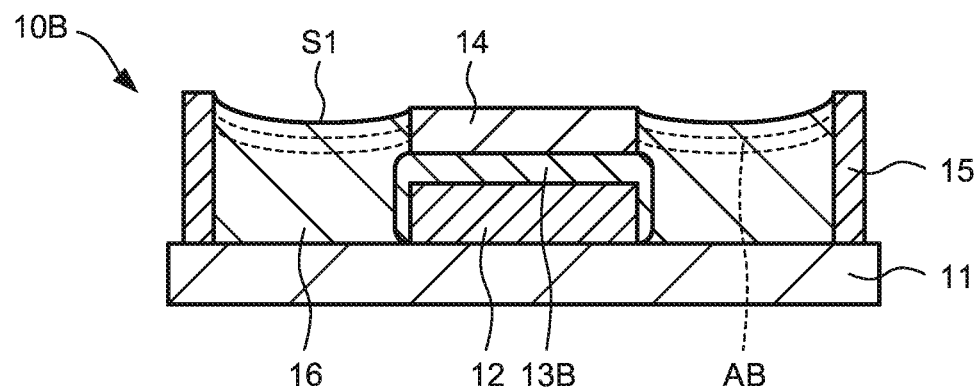
FIG. 5B is a cross-sectional view of a light-emitting device according to a second modification of the first embodiment.

FIG. 5B is a cross-sectional view of a light-emitting device 10B according to a second modification of the first embodiment. The light-emitting device 10B has the same configuration as those of the light-emitting devices 10 and 10A except for the configuration of a translucent member 13B. In the present modification, the translucent member 13B covers the entire side surface of the light-emitting element 12. That is, the translucent member 13B is in contact with the entire upper surface and the entire side surface of the light-emitting element 12. In the present modification, the covering body 16 covers the side surface of the light-emitting element 12 with the translucent member 13B interposed therebetween.

In the light-emitting device 10B, the covering body 16 is not completely in contact with the side surface of the light-emitting element 12. When the covering body 16 is configured in this manner, almost all of the light emitted from the side surface of the light-emitting element 12 can be made incident on the outer edge portion of the light transmitting member 14 by the translucent member 13B. Accordingly, it is possible to increase the light extracted from the outer edge portion of the light transmitting member 14. Therefore, the light-emitting device 10B emits light with high contrast.

Figure 5C:
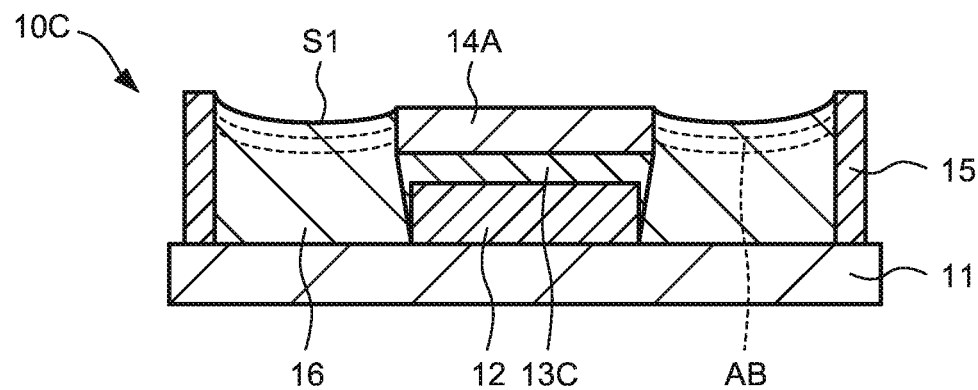
FIG. 5C is a cross-sectional view of a light-emitting device according to a third modification of the first embodiment.

FIG. 5C is a cross-sectional view of a light-emitting device 10C according to a third modification of the first embodiment. The light-emitting device 10C has the same configuration as that of the light-emitting device 10 except for the configuration of a translucent member 13C and a light transmitting member 14A. In the present modification, the light transmitting member 14A has an upper surface larger than the upper surface of the light-emitting element 12. The translucent member 13C is formed to extend from the side surface of the light-emitting element 12 to the bottom surface of the light transmitting member 14A.

In the present modification, the light emitted from the light-emitting element 12 enters the entire bottom surface of the light transmitting member 14A via the translucent member 13C, and then is extracted from the upper surface of the light transmitting member 14A to the outside. The covering body 16 covers the side surface of the translucent member 13C and the side surface of the light transmitting member 14A. Therefore, for example, the light emitted from the side surface of the light-emitting element 12 can be made incident on the outer edge portion of the light transmitting member 14A by the translucent member 13C. Therefore, for example, it is possible to provide the light-emitting device 10C in which the size of the light extraction surface is enlarged without changing the size of the light-emitting element 12 and the reduction in contrast is suppressed.

Figure 5D:
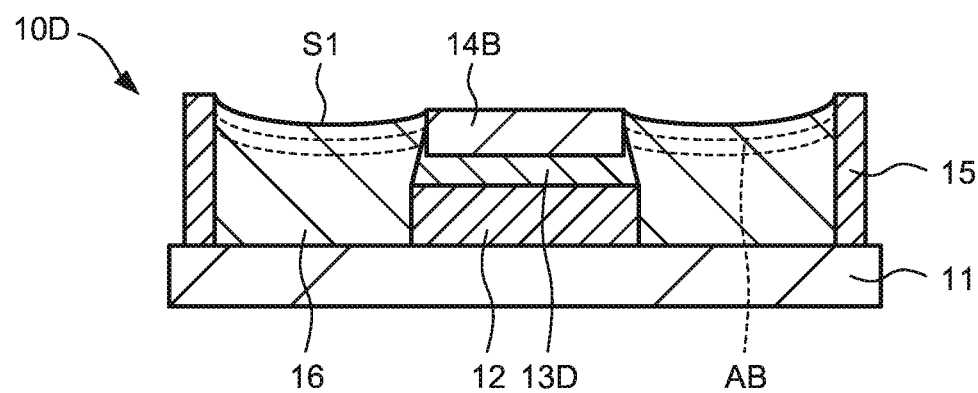
FIG. 5D is a cross-sectional view of a light-emitting device according to a fourth modification of the first embodiment.

FIG. 5D is a cross-sectional view of a light-emitting device 10D according to a fourth modification of the first embodiment. The light-emitting device 10D has the same configuration as that of the light-emitting device 10 except for the configuration of a translucent member 13D and a light transmitting member 14B. In the present modification, the light transmitting member 14B has an upper surface smaller than the upper surface of the light-emitting element 12. The translucent member 13D is formed to extend from the upper surface of the light-emitting element 12 to the side surface of the light transmitting member 14B.

In the present modification, the light emitted from the light-emitting element 12 enters the bottom surface and the side surface of the light transmitting member 14B via the translucent member 13D, and then is extracted from the upper surface of the light transmitting member 14B to the outside. The covering body 16 covers the side surfaces of the light-emitting element 12 and the translucent member 13D and the upper portion of the side surface of the light transmitting member 14B. Therefore, for example, it is possible to provide the light-emitting device 10D in which the size of the light extraction surface is reduced without changing the size of the light-emitting element 12 while the output and contrast are enhanced.

Figure 5E:
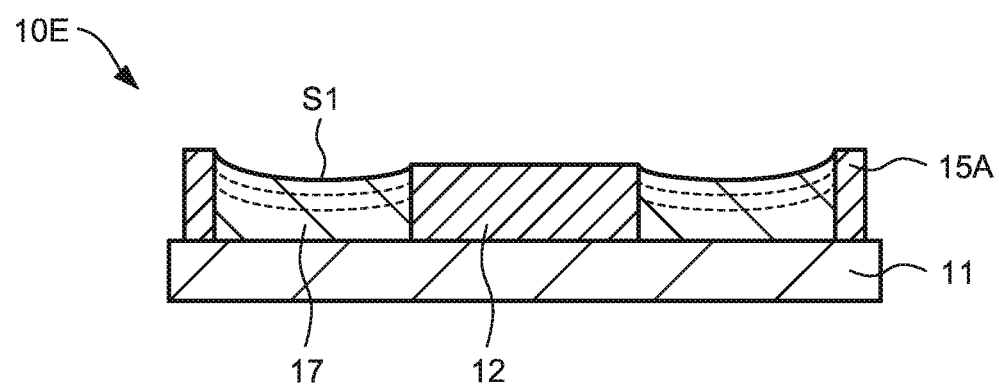
FIG. 5E is a cross-sectional view of a light-emitting device according to a fifth modification of the first embodiment.

FIG. 5E is a cross-sectional view of a light-emitting device 10E according to a fifth modification of the first embodiment. The light-emitting device 10E has the same configuration as that of the light-emitting device 10 except that the translucent member 13 and the light transmitting member 14 are not provided. The light-emitting device 10E includes the substrate 11, the light-emitting element 12 disposed on the substrate 11, and a covering body 17 covering the side surface of the light-emitting element 12. In the present modification, the light-emitting device 10E has a frame body 15A having a height corresponding to the height (thickness) of the light-emitting element 12. The covering body 17 is disposed in a region between the frame body 15A and the light-emitting element 12 on the substrate 11.

The covering body 17 has the same configuration as that of the covering body 16 except that it covers the side surface of the light-emitting element 12. The covering body 17 covers the side surface of the light-emitting element 12 and has an upper surface S1 exposed to the outside. Similarly to the covering body 16, the covering body 17 has a particle group PT including a plurality of titanium oxide particles (e.g., first to third titanium oxide particles P1 to P3) dispersed in a layered manner such that the density of a portion NB having a narrower band gap than that in other portions in each particle is lowered from the upper surface S1 toward the substrate 11.

In the present modification, the upper surface of the light-emitting element 12 is exposed to the outside. In this case, the light emitted from the light-emitting element 12 is directly extracted to the outside without passing through another medium. Also in the light-emitting device 10E, since the covering body 16 includes the particle group PT, a light-emitting device achieving high output and high contrast is provided.

In the present embodiment, the case where the covering body 16 has the absorption region AB and the scattering reflection region SC for visible light has been described. However, the configuration of the covering body 16 is not limited to this. For example, the light-emitting element 12 may be configured to emit light in a band other than visible light. In this case, the absorption region AB and the scattering reflection region SC of the covering body 16 only need to have absorptivity and reflectivity, respectively, with respect to the light in the other wavelength band and/or the light with another wavelength converted by the wavelength converter.

In other words, for example, the particles in the covering body 16, the band gap configuration thereof, and the medium only need to be adjusted so as to have a region having light absorption and light reflection properties corresponding to the wavelength of the light emitted from the light-emitting element 12 and the light emitted from the wavelength converter included in the translucent member 13 or the light transmitting member 14.

Further, in this case, in consideration of effectively providing the absorption region AB and the scattering reflection region SC in the covering body 16, for example, it is preferable that the titanium oxide particles in the particle group PT have an average particle diameter corresponding to the wavelength in the covering body 16 of the light emitted from the light-emitting element 12 and/or the light emitted from the wavelength converter included in the translucent member 13 or the light transmitting member 14.

In consideration of maintaining mechanical strength of the covering body 16, it is preferable that the covering body 16 has an integrally formed resin medium (e.g., silicone resin) in which a plurality of titanium oxide particles of the particle group PT are dispersed.

In the present embodiment, the case where the particle group PT has the first to third titanium oxide particles P1 to P3 has been described, but the configuration of the particle group PT is not limited to this. For example, the particle group PT may be composed of, for example, only two types of titanium oxide particles P1 and P2.

In this case, for example, the covering body 16 only needs to include a plurality of first titanium oxide particles P1 disposed at a position closest to the upper surface S1 and having a portion (portion NB) having a narrower band gap than the energy of the light emitted from the light-emitting element 12 at a high density, and a plurality of second titanium oxide particles P2 disposed closer to the substrate 11 than the first titanium oxide particles P1 and having a portion (portion NB) having a band gap narrower than the energy of the light emitted from the light-emitting element 12 at a low density.

For example, the particle group PT only needs to include at least the first titanium oxide particles P1. That is, the particle group PT only needs to include a plurality of titanium oxide particles (first titanium oxide particles P1) dispersed in the vicinity of the upper surface S1 of the covering body 16 and having a portion NB having a narrower band gap than that in other portions in each particle.

The particles constituting the absorption region AB and the scattering reflection region SC in the particle group PT are not limited to titanium oxide particles. For example, zinc oxide (ZnO) has the same properties as those of titanium oxide. For example, zinc oxide has a band gap energy of 3.37 eV and transmits visible light. In addition, zinc oxide has a property of absorbing ultraviolet light having a wavelength of 355 nm (for example, laser beam LB). Further, the refractive index of zinc oxide is 2.0, which is larger than the refractive index of the silicone resin (1.4 to 1.55). In addition, zinc oxide forms a deep donor level due to oxygen deficiency and narrows the band gap (a portion corresponding to a portion NB having a narrower band gap is formed), and has the property of absorbing visible light.

Therefore, as the particle group PT, for example, a metal oxide crystal such as a titanium oxide particle or a zinc oxide particle having a property of transmitting visible light in a crystal state without oxygen deficiency and absorbing visible light by oxygen deficiency can be used. For example, the first to third titanium oxide particles P1 to P3 may be replaced with the particles of the metal oxide having such properties, or the particles of the metal oxide may be contained in the particle group PT in addition to the first to third titanium oxide particles P1 to P3.

In addition to the titanium oxide particles or zinc oxide particles, particles that scatter light emitted from the light-emitting element 12 and/or light emitted from the wavelength converter contained in the translucent member 13 or the light transmitting member 14 may be added to the particle group PT. Examples of such particles include metal carbides, metal oxides, and metal nitrides such as silicon carbide (SiC), silicon nitride ($Si_2N_3$), gallium nitride (GaN), aluminum nitride (AlN), and aluminum oxide ($Al_2O_3$).

That is, the particle group PT only needs to include a plurality of particles dispersed in the covering body 16. When the particle group PT includes a plurality of particles including particles other than the titanium oxide particles and the zinc oxide particles, the plurality of particles may be dispersed at a uniform density in the covering body 16 or may be dispersed so as to gradually increase in density from the upper surface S1 toward the substrate 11. In addition, for example, all of the particles included in the particle group PT may be dispersed at the above-described concentration.

In this embodiment, the case where the light-emitting device 10 includes one light-emitting element 12 has been described. However, the light-emitting device 10 may include a plurality of light-emitting elements 12. Also in this case, for example, the covering body 16 having the particle group PT only needs to cover the side surface of the light transmitting member 14.

Thus, for example, the light-emitting device 10 includes the substrate 11, the light-emitting element 12 disposed on the substrate 11, the light transmitting member 14 disposed on the light-emitting element 12, and the covering body 16 that covers the side surface of the light transmitting member 14 on the substrate 11 and has the upper surface S1 exposed to the outside.

The covering body 16 has the particle group PT composed of a plurality of particles dispersed in the covering body 16. The particle group PT includes a plurality of titanium oxide particles (first titanium oxide particles P1) or zinc oxide particles dispersed in the vicinity of the upper surface S1 of the covering body 16 and having a portion NB having a narrower band gap than that in each particle. Therefore, it is possible to provide the light-emitting device 10 achieving high output and high contrast with a simple configuration.

For example, the light-emitting device 10E includes the substrate 11, the light-emitting element 12 disposed on the substrate 11, and the covering body 17 that covers the side surface of the light-emitting element 12 on the substrate 11 and has the upper surface S1 exposed to the outside. The covering body 17 has the particle group PT composed of a plurality of particles dispersed in the covering body 17. The particle group PT includes a plurality of titanium oxide particles (first titanium oxide particles P1) or zinc oxide particles dispersed in the vicinity of the upper surface S1 of the covering body 17 and having a portion NB having a narrower band gap than that in other portions in each particle. Therefore, it is possible to provide the light-emitting device 10E achieving high output and high contrast with a simple configuration.

Second Embodiment

Figure 6A:
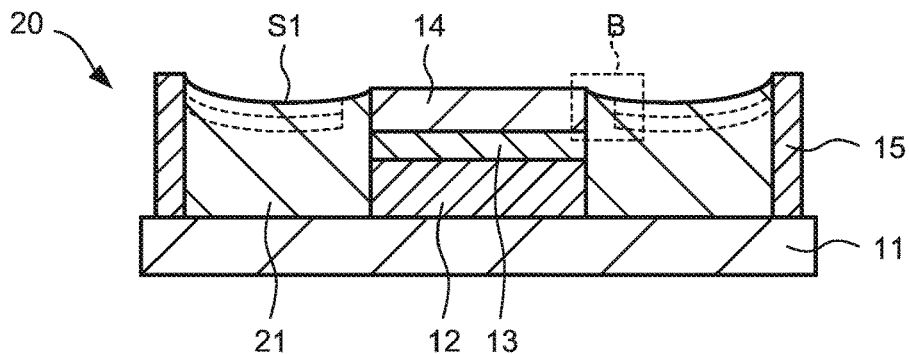
FIG. 6A is a cross-sectional view of a light-emitting device according to a second embodiment.
Figure 6B:
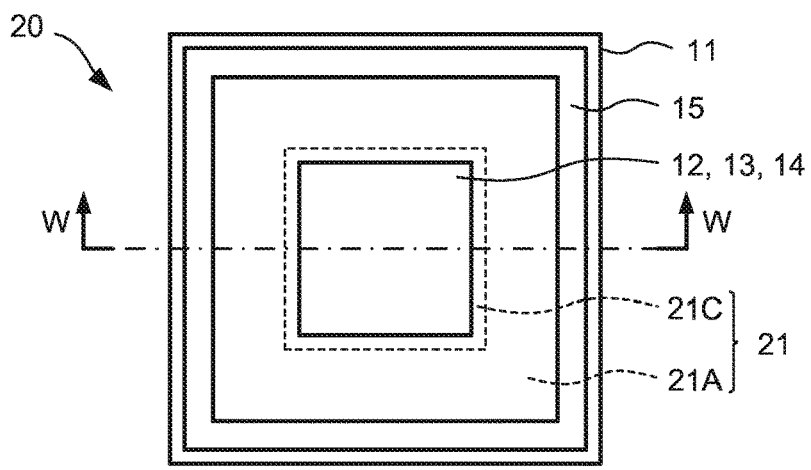
FIG. 6B is a top view of the light-emitting device according to the second embodiment.
Figure 6C:
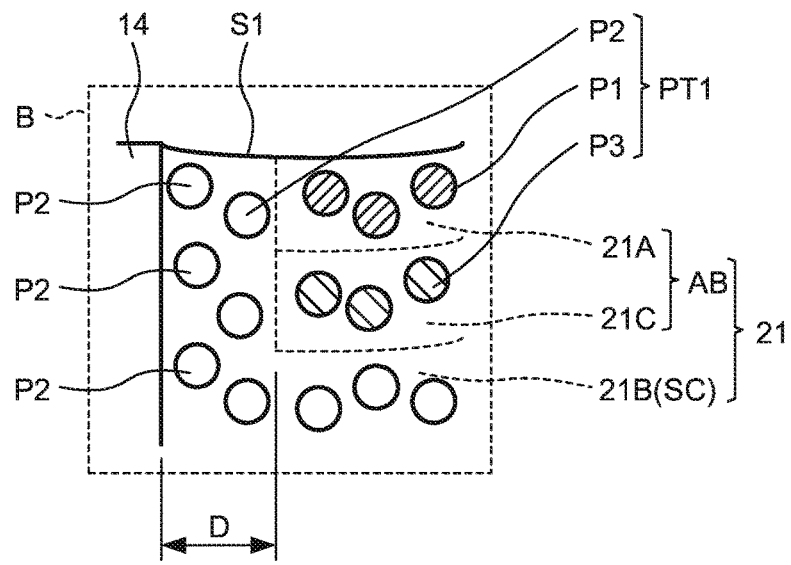
FIG. 6C is an enlarged cross-sectional view of the light-emitting device according to the second embodiment.

FIG. 6A is a cross-sectional view of a light-emitting device 20 according to a second embodiment. FIG. 6B is a top view of the light-emitting device 20. FIG. 6A is a cross-sectional view taken along line W-W in FIG. 6B. FIG. 6C is an enlarged cross-sectional view showing a part B surrounded by a broken line in FIG. 6A in an enlarged manner.

The light-emitting device 20 has the same configuration as that of the light-emitting device 10 except for the configuration of a covering body 21. In the light-emitting device 20, the covering body 21 covers the side surface of the light transmitting member 14 and has the upper surface S1 exposed to the outside, similarly to the covering body 16.

In the present embodiment, the covering body 21 has a particle group PT1 including a plurality of titanium oxide particles (first to third titanium oxide particles P1, P2, and P3) dispersed so that the density of the narrower band gap portion NB in each particle is lowered from a partial region of the upper surface S1 toward the substrate 11. In FIG. 6C, the titanium oxide particles P1 and P3 are hatched.

In other words, the first titanium oxide particles P1 forming the absorption region AB in the particle group PT1 are dispersed in a part of the upper surface S1 of the covering body 21. That is, the covering body 21 has the first dispersion region 21A only in a part of the upper surface S1. In the other region of the upper surface S1, the covering body 21 has a second dispersion region 21B which is a region in which only the second titanium oxide particles P2 are uniformly dispersed toward the substrate 11. The covering body 21 can be formed, for example, by irradiating only a part of the upper surface S0 of the particle-containing resin 16P with the laser beam LB.

In the present embodiment, the first titanium oxide particles P1 are dispersed in the covering body 21 so as to surround the light transmitting member 14 apart from the side surface of the light transmitting member 14 by a predetermined distance (distance D). Accordingly, the covering body 21 partially reflects and scatters the light entering the covering body 21 from the side surface of the light transmitting member 14 (such as the light L3 in FIG. 3). The light-emitting device 20 has a suitable configuration when the high output is given priority among the high contrast and high power, for example.

The balance between the output of the extracted light and the contrast can be adjusted by adjusting the distance D (FIG. 6C) from the side surface of the light transmitting member 14 to the absorption region AB in the covering body 21, that is, the thickness of the scattering reflection region SC in contact with the side surface of the light transmitting member 14 to the absorption region AB.

Figure 7A:
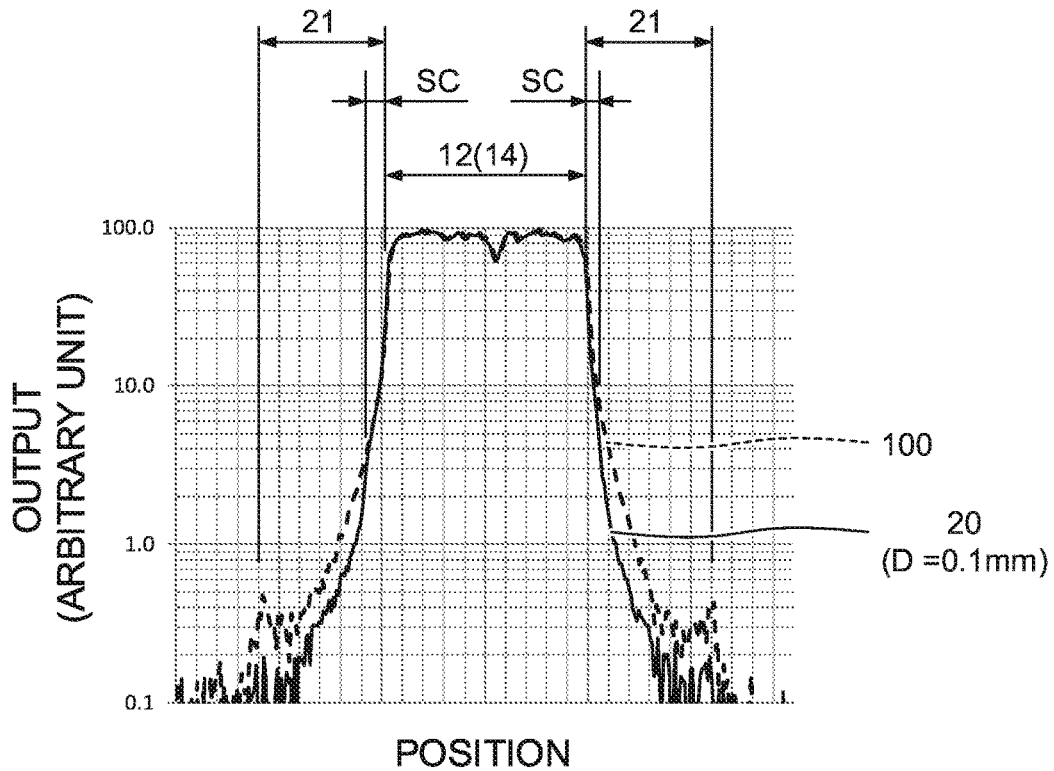
FIG. 7A is a diagram showing light output from the light-emitting device according to the second embodiment.

FIG. 7A is a diagram showing a distribution of light output from the light-emitting device 20. The horizontal axis of FIG. 7A indicates the position of the light-emitting device 20 along line W-W in FIG. 6B, and the vertical axis indicates the light output (the value obtained by normalizing the luminance with the maximum value). Also in FIG. 7A, the measurement result of the light-emitting device 100 according to the comparative examples is shown by a broken line and superimposed on the measurement result of the light-emitting device 20. FIG. 7A shows the measurement results of the light output from the light-emitting device 20 when the distance D from the light transmitting member 14 to the absorption region AB is 0.1 mm.

As shown in FIG. 7A, it can be understood that, also in the light-emitting device 20, the output from the region other than the region of the light-emitting element 12 (i.e., the light transmitting member 14) is suppressed compared to the light-emitting device 100, and the light having higher output is emitted from the region of the light-emitting element 12. That is, it is understood that the light-emitting device 20 is also a light-emitting device achieving high contrast without lowering the output.

Figure 7B:
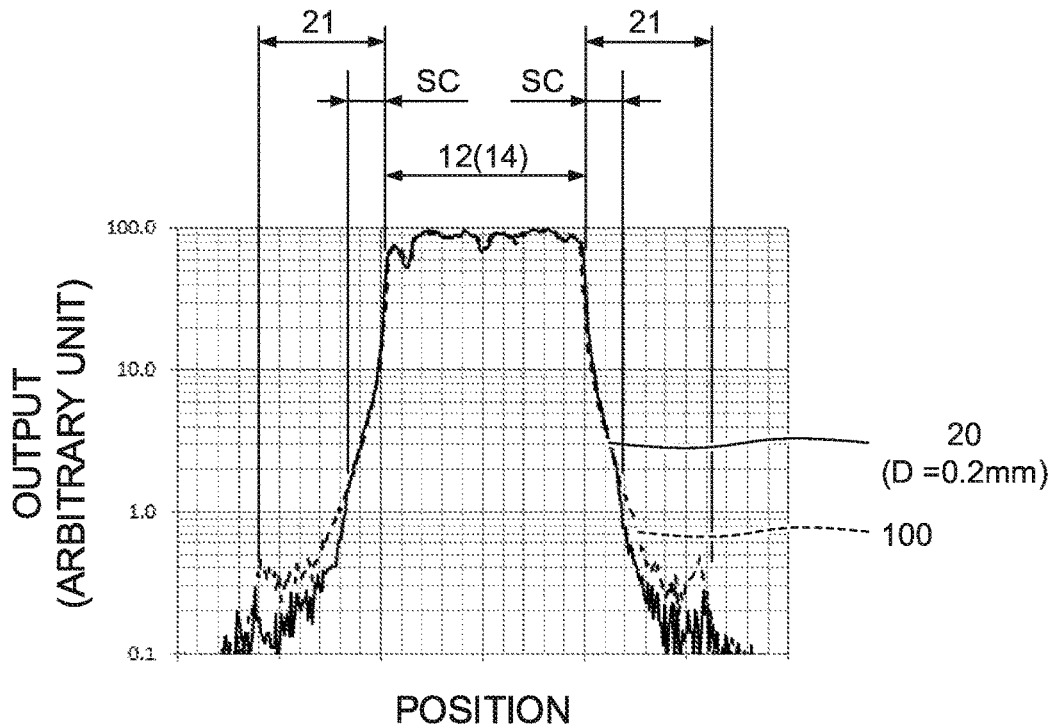
FIG. 7B is a diagram showing light output from the light-emitting device according to the second embodiment.

FIG. 7B shows the measurement result of the light output from the light-emitting device 20 when the distance D from the light transmitting member 14 to the absorption region AB is 0.2 mm. As shown in FIG. 7B, when the distance D is 0.2 mm, the light-emitting device 20 has the same output value as that of the light-emitting device 100 up to the region having the luminance of 1 when the luminance of the region of the light transmitting member 14 is 100.

That is, in the present embodiment, when the scattering reflection region SC is provided up to a position apart from the side surface of the light transmitting member 14 by a distance of 0.2 mm, light having an intensity of 1/100 of that of the upper surface of the light transmitting member 14 is extracted to the outside from the region of the outer edge portion of the scattering reflection region SC.

In consideration of maintaining high contrast, it is preferable to provide the scattering reflection region SC from the side surface of the light transmitting member 14 to a position by a distance D at which the intensity becomes 1/100 or more of the light intensity on the upper surface of the light transmitting member 14. In the present embodiment, it can be said that the distance D is preferably 0.2 mm or less. This is because light having an intensity of less than 1/100 is light having an intensity that does not deteriorate the contrast.

The distance D corresponds to a distance at which light can enter the covering body 21 (scattering reflection region SC). The distance D depends on the dispersion density of the titanium oxide particles. Accordingly, it is preferable, for example, to measure the output from the light transmitting member 14 and its surrounding covering body 21 as described above, and to provide a scattering reflection region SC to a position closer to the side surface of the light transmitting member 14 than the position where the output is 1/100 of the output from the upper surface of the light transmitting member 14.

That is, it is preferable that the distance D be a distance from the side surface of the light transmitting member 14 to a position within the region of the upper surface S1 of the covering body 21 from which light of 1/100 or more of the maximum intensity of the light emitted from the light transmitting member 14 is emitted. In addition, it is preferable that the covering body 21 have a plurality of titanium oxide particles (e.g., first to third titanium oxide particles P1, P2, and P3) dispersed so that the density of the narrower band gap portion NB in each particle is lowered in a region outside a position where light having an intensity of 1/100 of the light output from the light transmitting member 14 is emitted (a position apart from the side surface of the light transmitting member 14 by a distance D).

Also in the present embodiment, the light-emitting device 20 does not need to have the translucent member 13 and the light transmitting member 14. In addition, the covering body 21 does not need to have the scattering reflection region SC over the entire circumference in the vicinity of the side surface of the light-emitting element 12. For example, the covering body 21 only needs to have a particle group PT1 including a plurality of titanium oxides (first to third titanium oxide particles P1, P2, and P3) dispersed in layers so that the density of the narrower band gap portion NB in each particle is lowered from a portion of the upper surface S1 toward the substrate 11.

As described above, in this embodiment, for example, the first titanium oxide particles P1 (titanium oxide particles disposed at the position closest to the upper surface S1 and having a portion (portion NB) having a narrower band gap than the energy of the light emitted from the light-emitting element 12 at a density higher than that of the other particles) of the covering body 21 are dispersed in the covering body 21 so as to surround the side surface of the light transmitting member 14 apart from the side surface of the light transmitting member 14 by a predetermined distance D. Accordingly, it is possible to provide the light-emitting device 20 achieving high output and high contrast.

The covering body 21 has a plurality of second titanium oxide particles P2 having a portion (portion NB) having a narrower band gap than the energy of the emitted light from the light-emitting element 12 in a region inside the first titanium oxide particles P1 (a region in contact with the side surface of the light-emitting element 12 on the upper surface S1) at a density lower than that of the first titanium oxide particles P1. Therefore, the light-emitting device 20 has high output.

Third Embodiment

Figure 8A:
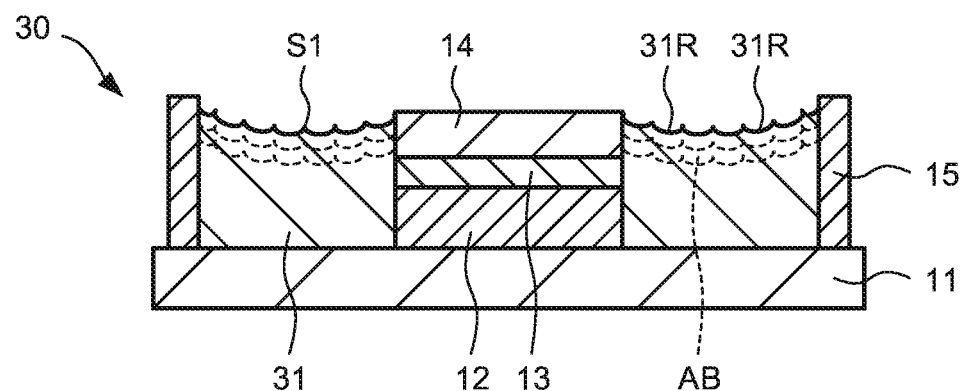
FIG. 8A is a cross-sectional view of a light-emitting device according to a third embodiment.
Figure 8B:
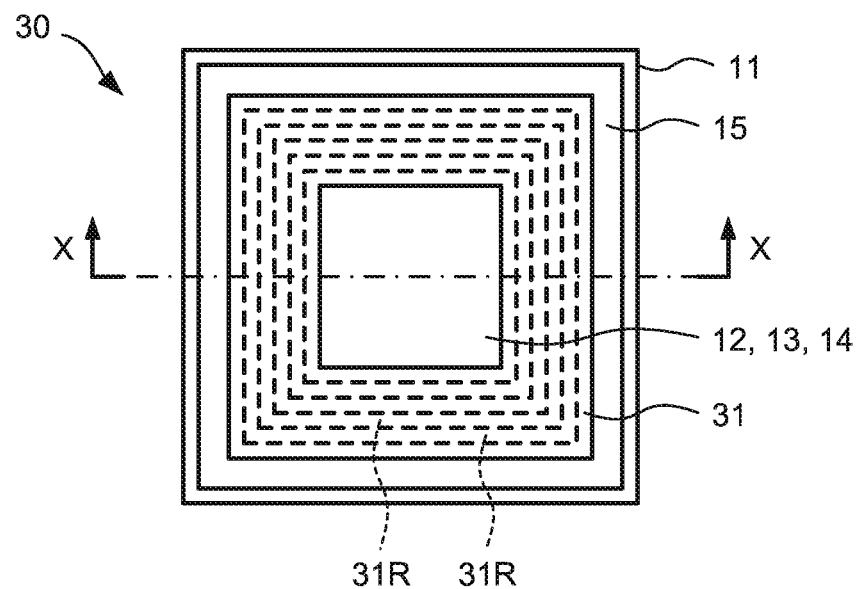
FIG. 8B is a top view of the light-emitting device according to the third embodiment.

FIG. 8A is a cross-sectional view of a light-emitting device 30 according to a third embodiment. FIG. 8B is a top view of the light-emitting device 30. FIG. 8A is a cross-sectional view taken along line X-X of FIG. 8B. The light-emitting device 30 has the same configuration as that of the light-emitting device 10 except for the configuration of the covering body 31.

The covering body 31 has a plurality of concave portions 31R on the upper surface S1. In the present embodiment, as shown in FIG. 8B, each of the concave portions 31R of the covering body 31 is formed in a groove shape so as to surround the periphery of the light-emitting element 12, the translucent member 13, and the light transmitting member 14. Each of the concave portions 31R has a cylindrical (imbricate) inner wall.

The covering body 31 can be formed, for example, by superimposing a laser beam LB (light having a wavelength in the ultraviolet region) on the upper surface S0 of the particle-containing resin 16P and irradiating the laser beam LB a plurality of times. More specifically, by irradiating the laser beam LB having a wavelength of 355 nm and an output of 25 kW/cm$^2$ or more with a specified pattern, and irradiating the laser beam LB with the same pattern again, the silicone resin is successively sublimated and removed from the surface, and irradiating traces of the laser beam LB remain on the surface of the silicone resin. As a result, a groove corresponding to the beam diameter of the laser beam LB and its moving direction is formed on the upper surface S0 of the particle-containing resin 16P. The resulting laser traces become the concave portions 31R of the covering body 31.

Note that the concave portions 31R of the covering body 31 can be formed not only by irradiating the laser beam LB a plurality of times, but also by adjusting, for example, the output of the laser beam LB, the scanning speed, and the like. The shape of the concave portion 31R is not limited to the illustrated shape. For example, a convex portion may be formed on the upper surface of the covering body 31, or a continuous irregularity may be formed in the form of waves. The covering body 31 may have an upper surface S1 having various irregularities.

In this embodiment as well, the covering body 31 has the particle group PT, having titanium oxide particles (first and third titanium oxide particles P1 and P3) having a portion (portion NB) having a narrower band gap than the energy of visible light, in the vicinity of the upper surface S1 similarly to the covering body 16.

In the present embodiment, since the upper surface S1 of the covering body 31 has, for example, the repeatedly provided concave portions 31R, the area of the surface exposed to the outside is increased as compared to, for example, a flat surface (for example, the upper surface S1 of the covering body 16). As a result, the surface area of the absorption region AB provided in the covering body 31 is increased. Therefore, the covering body 31 absorbs light (such as the light L3 in FIG. 3) entering the covering body 31 from the side surface of the light transmitting member 14 with high efficiency. Therefore, the light-emitting device 30 has a suitable configuration when the contrast is given priority among the contrast and the output, for example.

In the present embodiment, the case where the concave portions 31R are formed over the entire upper surface S1 of the covering body 31 has been described. However, the concave portions 31R may be formed only on a part of the upper surface S1 of the covering body 31. Also, the shapes of the concave portions 31R are not limited to the shapes shown in FIGS. 8A and 8B. The covering body 31 only needs to have a concave portion 31R on the upper surface S1.

This application is based on a Japanese Patent application No. 2018-116751 which is hereby incorporated by reference.

What is claimed is:

1. A light-emitting device comprising:
   a substrate;
   a light-emitting element disposed on said substrate;
   a light transmitting member disposed on said light-emitting element; and
   a covering body that is disposed on said substrate, that covers a side surface of said light transmitting member, and that has an upper surface exposed to an outside of said light transmitting member,
   wherein:
   said covering body has a particle group composed of a plurality of particles dispersed in said covering body,
   said particle group includes a plurality of titanium oxide particles or zinc oxide particles dispersed in a vicinity of said upper surface of said covering body and each having a portion having a narrower band gap than in other portions of the particle, and said particle group includes first titanium oxide particles or zinc oxide particles disposed at a position closest to said upper surface and having said portion having a narrower band gap at a highest density, and second titanium oxide particles or zinc oxide particles disposed closer to said substrate than said first titanium oxide particles or zinc oxide particles and having said portion having a narrower band gap at a density lower than that of said first titanium oxide particles or zinc oxide particles.

2. The light-emitting device according to claim 1, wherein said covering body has an integrally formed resin medium in which said plurality of particles are dispersed.

3. The light-emitting device according to claim 1, wherein each of said plurality of titanium oxide particles or zinc oxide particles comprises a particle body and a coating film covering said particle body.

4. The light-emitting device according to claim 1, wherein said first titanium oxide particles or zinc oxide particles are dispersed in a region within a depth range of 20 μm or less from said upper surface of said covering body.

5. The light-emitting device according to claim 1, wherein said plurality of titanium oxide particles or zinc oxide particles are dispersed in said covering body so as to surround said side surface of said light transmitting member apart from said side surface of said light transmitting member by a predetermined distance.

6. The light-emitting device according to claim 5, wherein said predetermined distance is a distance from said side surface of said light transmitting member to a position within a region of said upper surface of said covering body from which light of 1/100 or more of a maximum intensity of light emitted from said light transmitting member is emitted.

7. The light-emitting device according to claim 1, wherein said covering body has irregularities on said upper surface.

8. The light-emitting device according to claim 1, wherein each of said plurality of titanium oxide particles or zinc oxide particles has an average particle diameter corresponding to a wavelength in said covering body of light emitted from said light emitting element.

9. A light-emitting device comprising:
a substrate;
a light-emitting element disposed on said substrate;
a light transmitting member disposed on said light-emitting element; and
a covering body that is disposed on said substrate, that covers a side surface of said light transmitting member, and that has an upper surface exposed to an outside of said light transmitting member,
wherein:
said covering body has a particle group composed of a plurality of particles dispersed in said covering body,
said particle group includes a plurality of titanium oxide particles or zinc oxide particles dispersed in a vicinity of said upper surface of said covering body and each having a portion having a narrower band gap than in other portions of the particle, and
said plurality of particles in said particle group are dispersed in a range of 5 to 70 wt % in said covering body.

10. The light-emitting device according to claim 9, wherein said plurality of particles in said particle group are dispersed at a uniform density in said covering body.

11. The light-emitting device according to claim 9, wherein said plurality of particles in said particle group are dispersed so as to gradually increase in density from said upper surface toward said substrate in said covering body.

12. The light-emitting device according to claim 9, wherein said particle group includes said plurality of titanium oxide particles or zinc oxide particles dispersed so that a density of a portion having a narrower band gap than that in other portions in each particle is lowered from said upper surface of said covering body toward said substrate.

13. The light-emitting device according to claim 9, The light-emitting device according to claim 1, wherein said covering body has an integrally formed resin medium in which said plurality of particles are dispersed.

14. The light-emitting device according to claim 9, wherein said particle group includes first titanium oxide particles or zinc oxide particles disposed at a position closest to said upper surface and having said portion having a narrower band gap at a highest density, and second titanium oxide particles or zinc oxide particles disposed closer to said substrate than said first titanium oxide particles or zinc oxide particles and having said portion having a narrower band gap at a density lower than that of said first titanium oxide particles or zinc oxide particles.

15. The light-emitting device according to claim 14, wherein said first titanium oxide particles or zinc oxide particles are dispersed in a region within a depth range of 20 μm or less from said upper surface of said covering body.

16. The light-emitting device according to claim 9, wherein each of said plurality of titanium oxide particles or zinc oxide particles comprises a particle body and a coating film covering said particle body.

17. The light-emitting device according to claim 9, wherein said plurality of titanium oxide particles or zinc oxide particles are dispersed in said covering body so as to surround said side surface of said light transmitting member apart from said side surface of said light transmitting member by a predetermined distance.

18. A light-emitting device comprising:
a substrate;
a light-emitting element disposed on said substrate; and
a covering body that is disposed on said substrate, that covers a side surface of said light-emitting element, and that has an upper surface exposed to an outside of said light-emitting element,
wherein:
said covering body has a particle group composed of a plurality of particles dispersed in said covering body,
said particle group includes a plurality of titanium oxide particles or zinc oxide particles dispersed in a vicinity of said upper surface of said covering body and each having a portion having a narrower band gap than in other portions of the particle, and
said particle group includes first titanium oxide particles or zinc oxide particles disposed at a position closest to said upper surface and having said portion having a narrower band gap at a highest density, and second titanium oxide particles or zinc oxide particles disposed closer to said substrate than said first titanium oxide particles or zinc oxide particles and having said portion having a narrower band gap at a density lower than that of said first titanium oxide particles or zinc oxide particles.

19. The light-emitting device according to claim 18, wherein said first titanium oxide particles or zinc oxide particles are dispersed in a region within a depth range of 20 μm or less from said upper surface of said covering body.

20. The light-emitting device according to claim 18, wherein said plurality of titanium oxide particles or zinc oxide particles are dispersed in said covering body so as to surround said side surface of said light-emitting element apart from said side surface of said light-emitting element by a predetermined distance.

21. A light-emitting device comprising:
a substrate;
a light-emitting element disposed on said substrate; and
a covering body that is disposed on said substrate, that covers a side surface of said light-emitting element, and that has an upper surface exposed to an outside of said light-emitting element,
wherein:
said covering body has a particle group composed of a plurality of particles dispersed in said covering body,
said particle group includes a plurality of titanium oxide particles or zinc oxide particles dispersed in a vicinity of said upper surface of said covering body and each having a portion having a narrower band gap than in other portions of the particle, and
said plurality of particles in said particle group are dispersed in a range of 5 to 70 wt % in said covering body.

22. The light-emitting device according to claim 21, wherein said plurality of particles in said particle group are dispersed at a uniform density in said covering body.

23. The light-emitting device according to claim 21, wherein said plurality of particles in said particle group are dispersed so as to gradually increase in density from said upper surface toward said substrate in said covering body.

* * * * *